United States Patent [19]

Jörg

[11] 4,327,310
[45] Apr. 27, 1982

[54] SPARK CIRCUIT

[76] Inventor: Manfred Jörg, Stadelnerstrasse 18, D-8510 Fuerth, Fed. Rep. of Germany

[21] Appl. No.: 121,554

[22] Filed: Feb. 14, 1980

[30] Foreign Application Priority Data

Feb. 20, 1979 [DE] Fed. Rep. of Germany ....... 2906473

[51] Int. Cl.³ .................... H05B 37/02; H05B 39/04; H05B 41/36
[52] U.S. Cl. ................................ 315/209 R; 315/224; 315/306; 315/307; 361/253; 361/266; 431/258; 123/627; 123/644
[58] Field of Search ....................... 123/629, 644, 623; 315/209, 224, 163, 165, 307, 306, 291; 361/253, 256; 307/526; 431/258, 266

[56] References Cited

U.S. PATENT DOCUMENTS

| 3,295,014 | 12/1966 | Fisher et al. ................. | 315/224 X |
| 3,397,031 | 8/1968 | Kern et al. ................... | 315/224 X |
| 3,892,219 | 7/1975 | Preiser et al. ................. | 123/629 |
| 3,901,205 | 8/1975 | Brungsberg .................. | 123/644 |
| 3,937,193 | 2/1976 | Kim ............................. | 123/644 |
| 4,176,645 | 12/1979 | Jundt et al. ................... | 123/644 |
| 4,228,779 | 10/1980 | Wetzel ......................... | 123/644 |
| 4,230,970 | 10/1980 | Potter et al. ................. | 315/307 |

FOREIGN PATENT DOCUMENTS

| 52-3943 | 1/1977 | Japan ................... | 123/644 |
| 54-17432 | 2/1979 | Japan ................... | 123/644 |

Primary Examiner—Saxfield Chatmon, Jr.

[57] ABSTRACT

A spark circuit for heating equipment used on automobiles in which a switch interrupts current flow in the primary of an ignition coil. A comparator compares the actual value of current flowing in the primary against a predetermined nominal value, and current to the switch is interrupted when the values reach parity, so as to render the switch non-conductive during the interruption with resulting auto-induction in the secondary of the ignition coil.

8 Claims, 4 Drawing Figures

SPARK CIRCUIT

BACKGROUND OF THE INVENTION

The present invention relates to a spark circuit, particularly—but not exclusively—a spark circuit suitable for ignition purposes for heating equipment used on automobiles.

Spark circuits are used to ignite such combustible fuels as gasoline, diesel oil or gas on heating equiqment; they have arrangements which interrupt the flow of electrical current in the primary winding of the ignition coil which causes a high-voltage pulse to be produced in the seconary and the high voltage in turn produces an ignition spark which jumps across a spark gap defined by electrodes which extend into the combustible medium, respectively into the space or chamber of the heating equipment into which such combustible medium is admitted.

Where this type of equipment is used in e.g. private homes, it is mostly operated with a net-current supplied leakage-reactance transformer. For mobile applications, such as motor vehicles, boats, vans or mobile homes, this type of equipment is used, inter alia, to operate heating equipment. If such heating equipment is not operated by the drive of the vehicle itself (e.g. hot water from the radiator), a spark circuit is necessary which receives electrical energy from the vehicle battery or from the generator driven by the vehicle drive.

It is known to use various mechanical chopper or vibrator arrangements which operate according to the principle of Wagner's Hammer; however, these are subject to malfunction, have a relatively short life time and are rather expensive to manufacture, in addition to which they tend to produce high-frequency interference. For this reason it is now most common to use electronic interrupter circuits which are constructed either as self-controlled freely oscillating converters, or else are constructed as remote controlled astable multivibrators. There are various types and special constructions of these electronic circuit arrangements.

In all of them, however, there is a strong dependence of the starting voltage $U_Z$ and the spark energy $W_f$ upon the respective battery voltage or other supply voltage $U_{bat}$. As a result, whenever such equipment is used in the conventional vehicle supply systems having 12 volt or 24 volt batteries, respectively generators, especially adapted construction of the spark circuit is needed. In addition, the strong dependency of the characteristic lines for the starting voltage and the spark energy in dependence upon the battery voltage, has the disadvantageous result that particularly in the reduced-voltage operation which is especially important during winter due to cold and weakened batteries, the reduced current supply causes the starting voltage and even more the spark energy to drop. The relationship is primarily proportional to the battery voltage and starting voltage and quadratic as between battery voltage and spark energy. In extreme cases this can mean that too small a starting-ignition voltage and/or too small a spark energy exist to cause ignition, so that the heating system cannot operate. In addition, the known spark circuits have the further disadvantage—and this is particularly true for the remote-controlled spark circuits—that in the overvoltage region there is a high amount of lost-energy heat due to such erasion effects in the exciter winding.

SUMMARY OF THE INVENTION

Accordingly, it is an object of the present invention to avoid the disadvantages of the prior art.

A more particular object of the invention is to produce a spark circuit which is equally well suited for operation with 12-volt and 24-volt current-supply systems.

Still another object of the invention is to provide a spark circuit of the type in question in which the disadvantages are avoided which result from the voltage fluctuations of plus-minus 25% of nominal voltage, which are permissible in motor vehicle supply circuits.

Pursuant to the above objects, and others which will become apparent hereafter, one feature of the invention resides in a spark circuit, which is particularly but not exclusively suitable for heating equipment for automobiles, which comprises a first source of electrical energy; a charging circuit connected with the source and including an ignition coil having a primary and normally conductive electrically operated switch means operative for interrupting current flow in the primary. A second source of constant electrical energy is connected in circuit with the switch means and supplies the same with current required to keep the switch means conductive. Comparator means is connected in circuit with the primary and operative for comparing the actual value of current flowing in the primary against a predetermined nominal value, and for momentarily interrupting the supply of current from the second source to the switch means when the aforementioned values reach parity, so as to render the switch means non-conductive during the interruption with resulting auto-induction in the secondary of the ignition coil.

The invention will hereafter be described with reference to exemplary embodiments illustrated in the drawings. However, it should be understood that these are for purposes of explanation only and that the scope of the protection sought is defined exclusively in the appended claims.

DESCRIPTION OF PREFERRED EMBODIMENTS

Figure 1:
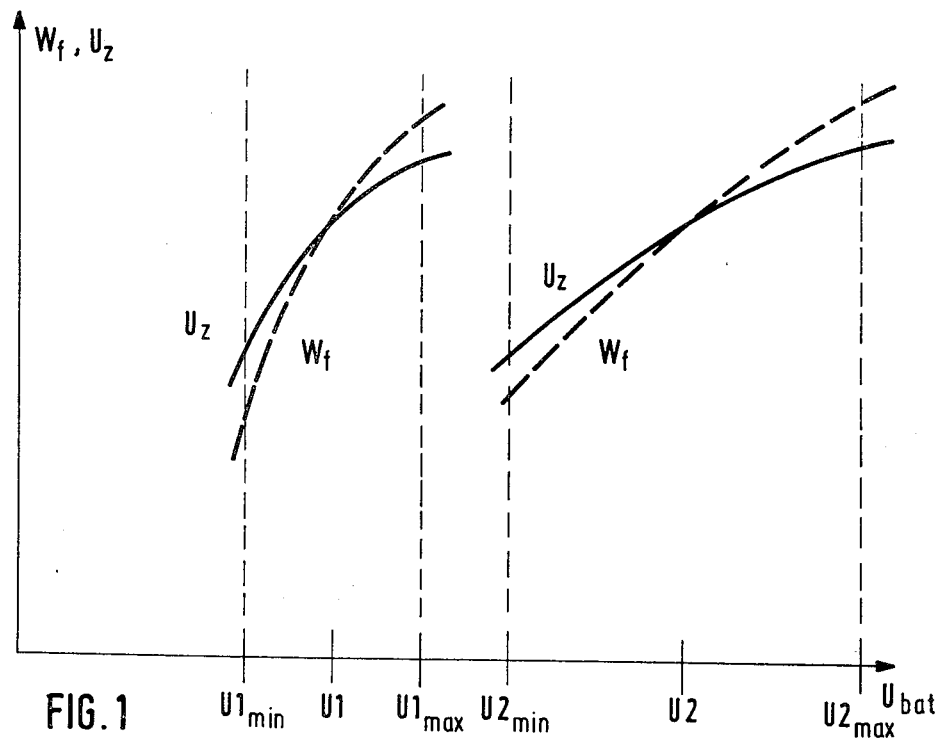
FIG. 1 is a diagram, showing the qualitative relationship of the starting voltage and the spark-energy dependence upon the operating voltage in the prior-art systems.

Referring firstly to the diagram of FIG. 1 which relates to the prior-art systems, it will be evident that there is a strong dependence of the starting voltage $U_z$ and the spark energy $W_f$ in dependence upon the operating voltage $U_{bat}$. One result of this is that for operating voltages voltage ranges U1 and U2 (for example 12 volts and 24 volts) different spark circuit are required. In addition, due to the strong battery voltage dependence each such spark circuit is nevertheless prone to substantial dangers of malfunction, because these spark circuits must be so constructed that even at the permissible supply voltage fluctuations of plus-minus 25% of the nominal current they are still capable of operating satisfactorily.

The invention avoids these problems, as will be discussed hereafter.

Figure 2:
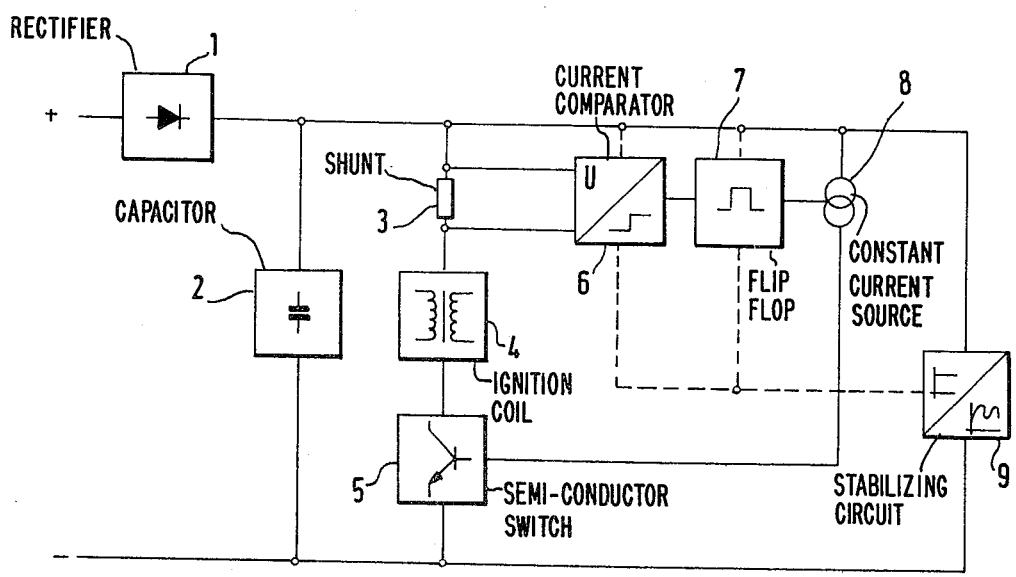
FIG. 2 is a block diagram of a spark circuit according to the invention.
Figure 3:
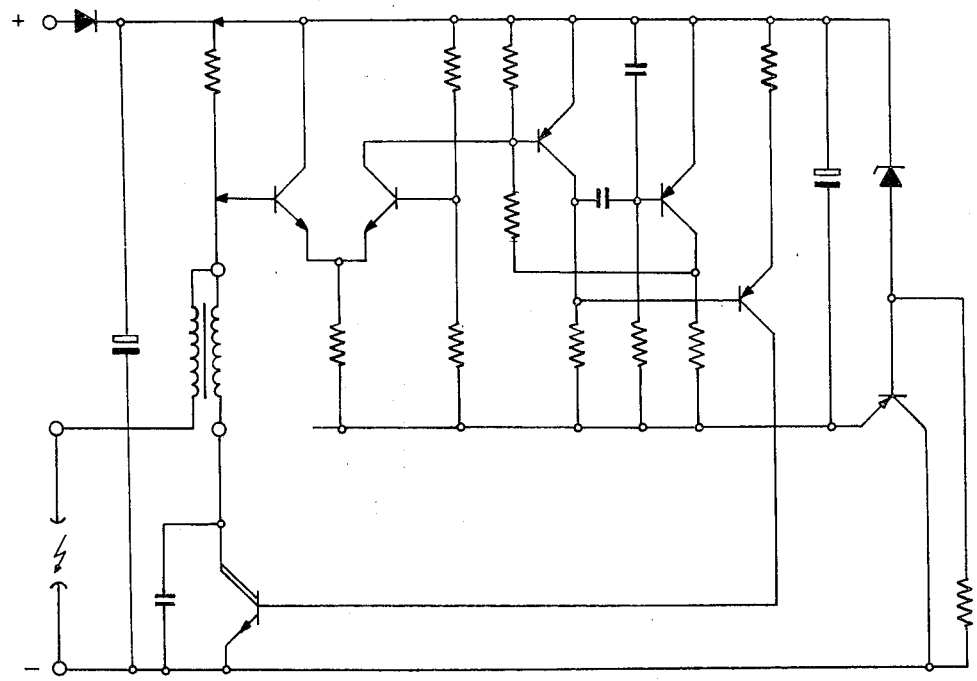
FIG. 3 is an actual circuit diagram of a spark circuit according to the invention.

FIG. 2 is a block diagram illustrating a spark circuit according to the present invention. When the positive and negative pulse of the spark circuit in FIG. 2 are connected to the corresponding pulse of a non-illustrated battery, current flows via the device 1 which protects against damage due to inadvertent reversal of the pole connections. This current charges the capacitor 2 which serves as a buffer element and a high frequency filter. Parallel thereto the current flows through a shunt 3, the primary winding of the ignition coil 4 and the semiconductor switch 5 which is in conductive state, back to the current source, i.e. here the battery.

Due to the inductivity of the primary the current value will be zero at the moment the circuit is energized, and will then rise according to an exponential function. This produces a proportional voltage drop at the shunt 3, and this voltage drop is compared in the current comparator 6 with a predetermined current value. When the two values reach parity, i.e. as soon as the voltage drop begins to exceed the predetermined nominal value, a trigger signal is initiated which energizes the impulse circuit 7—preferably in form of a monostable flip-flop—to produce a single pulse of a pre-defined length. For the duration of this impulse the constant current source 8, which produces the control current necessary to maintain the semiconductor 5 conductive, is deactivated. As a result, the current flow through the primary of the ignition coil 4 is abruptly interrupted, causing the auto-induction in the secondary of the ignition coil 4, and thus producing the high-voltage pulse necessary to produce the ignition spark at the not illustrated spark electrodes.

After expiration of the time for the impulse produced in the circuit 7, the constant current source 8 is reactivated and the current supplied by it to the semiconductor switch 5 renders the latter conductive again so that the flow of current through the primary circuit of the ignition coil 4 can begin again.

The stabilizing circuit 9 produces the necessary constant starting voltage which is acquired for supplying the circuit 7 and the current comparator 6, as well as to produce the nominal value for the current comparator 6. As mentioned before, the supply voltage acting at the positive and negative pulse of the spark circuit may fluctuate by plus-minus 25% in accordance with the permissible fluctuations of the vehicle current supply, so that the stabilizing circuit 9 is necessary in order to obtain the required constant starting voltage.

Because of the physical relationship for the energy storage in an inductance $W_1 = \frac{1}{2} \times L \times L^2$ the stored energy and thus the spark energy and the starting voltage can be maintained constant with the received current—i.e. the current which was flowing immediately before the interruption of the current flow through the primary of the ignition coil 4—is supervised and maintained constant since the inductance itself already constitutes an ignition coil constant.

The use of a constant current source in place of the usually employed resistance between the trigger circuit and the semiconductor switch, makes it possible to maintain the control conditions for the semiconductor optimum and independent of the battery voltage. If a resistor were used, the control current for the semiconductor switch 5 would be low if the battery current were low, which would lead to an additional voltage loss at the semiconductor switch 5. On the other hand, if the operating voltage would be high, a strong heating-up of the resistor would result unless special expensive counter measures were used.

Figure 4:
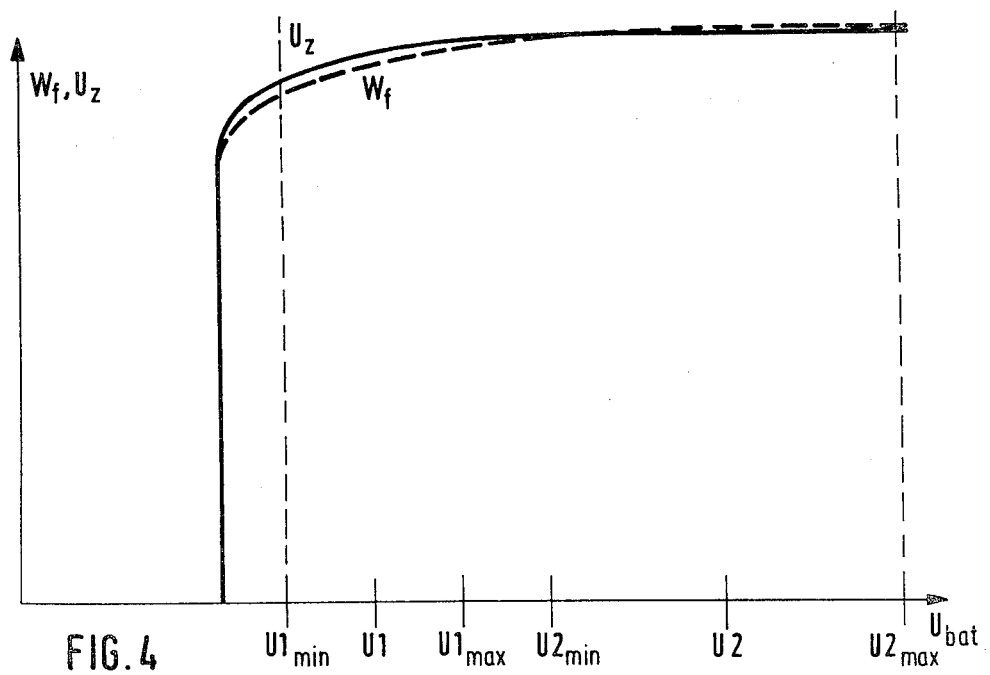
FIG. 4 is a view similar to FIG. 1, but illustrating the same relationships as in FIG. 1 as applied to a spark circuit according to the present invention.

The diagram in FIG. 4 illustrates the same relationships as the one in FIG. 1, but as they apply to the spark circuit according to the present invention. It will be seen that the two values (i.e. starting voltage and spark energy) now show a behavior which is largely independent of operating voltage over a wide voltage range, so that it is possible in particular to so construct the inventive spark circuit that it is equally well suitable for 12 volt as well as for 24 volt operating-current supply systems.

It will be appreciated that the invention is by no means restricted to the exemplary embodiment, since various modifications are possible without departing from the principle of the invention. Moreover, the spark circuit according to the invention is not usable only as an ignition spark circuit, but is suitable generally in the area of stabilized high-voltage production.

The invention having been described hereinbefore with reference to an exemplary embodiment, it will be understood that the scope of protection which is sought is defined exclusively in the appended claims.

What is claimed is:

1. A spark circuit for producing an ignition spark for heating equipment comprising a first source of electrical energy, a charging circuit connected with said source and including an ignition coil having a primary winding and a secondary winding, and normally conductive electrically operated switch means connected to interrupt current flow in the primary winding; a second source of electrical energy connected to said switch means for supplying the same with current required to keep the switch means conductive; and comparator means coupled to said primary winding and operative for comparing the value of current flowing in the primary with a predetermined nominal value, and for momentarily interrupting the supply of current from said second source to said switch means when said values reach parity, so as to render said switch means non-conductive during said interruption with resulting auto-induction in said secondary, and thus producing a high voltage pulse to produce said ignition spark for said heating equipment.

2. A spark circuit as defined in claim 1; and further comprising a voltage stabilizing network coupled to said comparator means for maintaining the operation thereof independent of the operating voltage of the spark circuit.

3. A spark circuit as defined in claim 1; and further comprising a pulse generator connected between said comparator and said second source of electrical energy.

4. A spark circuit as defined in claim 3, wherein said pulse generator has an inactive stable phase and an active astable phase, said second source being activated during said inactive phase and deactivated during said active phase.

5. A spark circuit as defined in claim 4, wherein said pulse generator comprises a monostable flip-flop.

6. A spark circuit as defined in claim 4, further comprising two cooperating timing elements connected to maintain an oscillation in said circuit.

7. A spark circuit as defined in claim 1 further comprising means for determining the time required to charge said ignition coil to a predetermined value as a function of the inductance of said primary.

8. A spark circuit is defined in claim 1; further comprising a charging capacitor interposed in said circuit, and a pulse circuit having an activated phase in which it interrupts the flow of current through said primary, the pulse duration of said pulse circuit being determined by the storage capacity of said capacitor.

* * * * *